United States Patent [19]

Johnson et al.

[11] 4,190,901
[45] Feb. 26, 1980

[54] PRINTED CIRCUIT BOARD APPARATUS WHICH FACILITATES FABRICATION OF UNITS COMPRISING A DATA PROCESSING SYSTEM

[75] Inventors: Robert B. Johnson, Billerica; Chester M. Nibby, Jr., Peabody, both of Mass.

[73] Assignee: Honeywell Information Systems Inc., Waltham, Mass.

[21] Appl. No.: 856,433

[22] Filed: Dec. 1, 1977

[51] Int. Cl.² ................... G11C 5/02; G11C 5/06
[52] U.S. Cl. ..................... 365/72; 361/400; 361/409; 365/63
[58] Field of Search .................. 365/63, 72; 361/400–410

[56] References Cited

U.S. PATENT DOCUMENTS

| 3,751,645 | 8/1973 | Brandsma et al. | 235/152 |
| 3,917,984 | 11/1975 | Kong et al. | 361/403 |

Primary Examiner—Stuart N. Hecker

Attorney, Agent, or Firm—Faith F. Driscoll; Nicholas Prasinos; Ronald T. Reiling

[57] ABSTRACT

A printed circuit board assembly includes at least two layers which is able to accommodate a subsystem such as a memory subsystem designed to have one or more optional features. The two layers of the printed circuit board when etched include the required number of horizontal and vertical paths to be connected to all of the integrated circuit chips to be positioned and interconnected thereon. The required holes for such integrated circuit chips when drilled include first sets of holes for mounting groups of integrated circuit chips required for implementing a first group of features and which are to be interconnected to the other integrated circuit chips of the subsystem mounted on the different sections of the board. Second sets of holes are included on the board so as to have a predetermined relationship with the first sets of holes for mounting alternative groups of integrated circuit chips to be interconnected in a manner to implement other features. Thereafter, the circuit board is populated with only those integrated circuit chips required for construction of a memory subsystem with one or more selected features.

17 Claims, 16 Drawing Figures

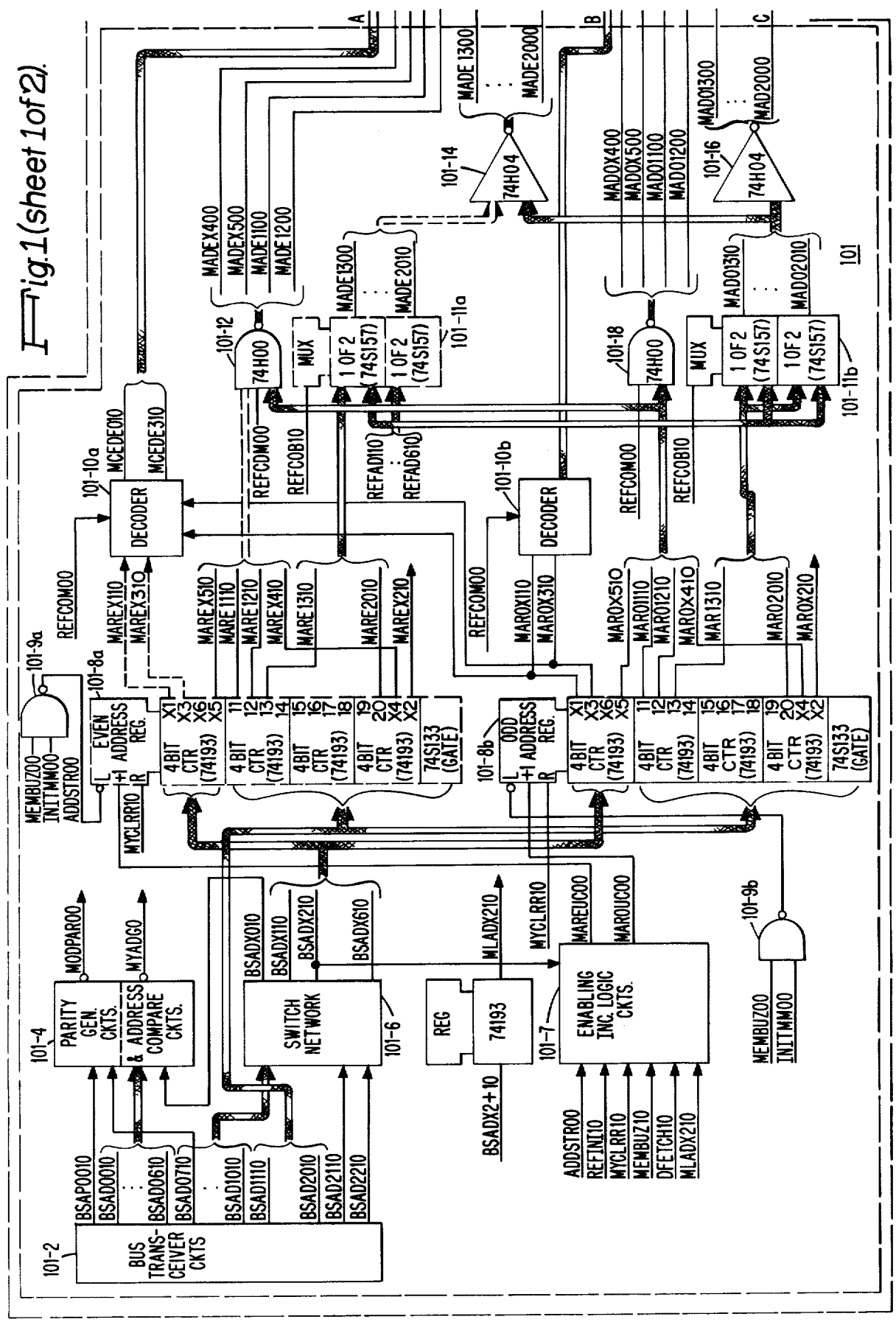
Fig. 1 (sheet 1 of 2).

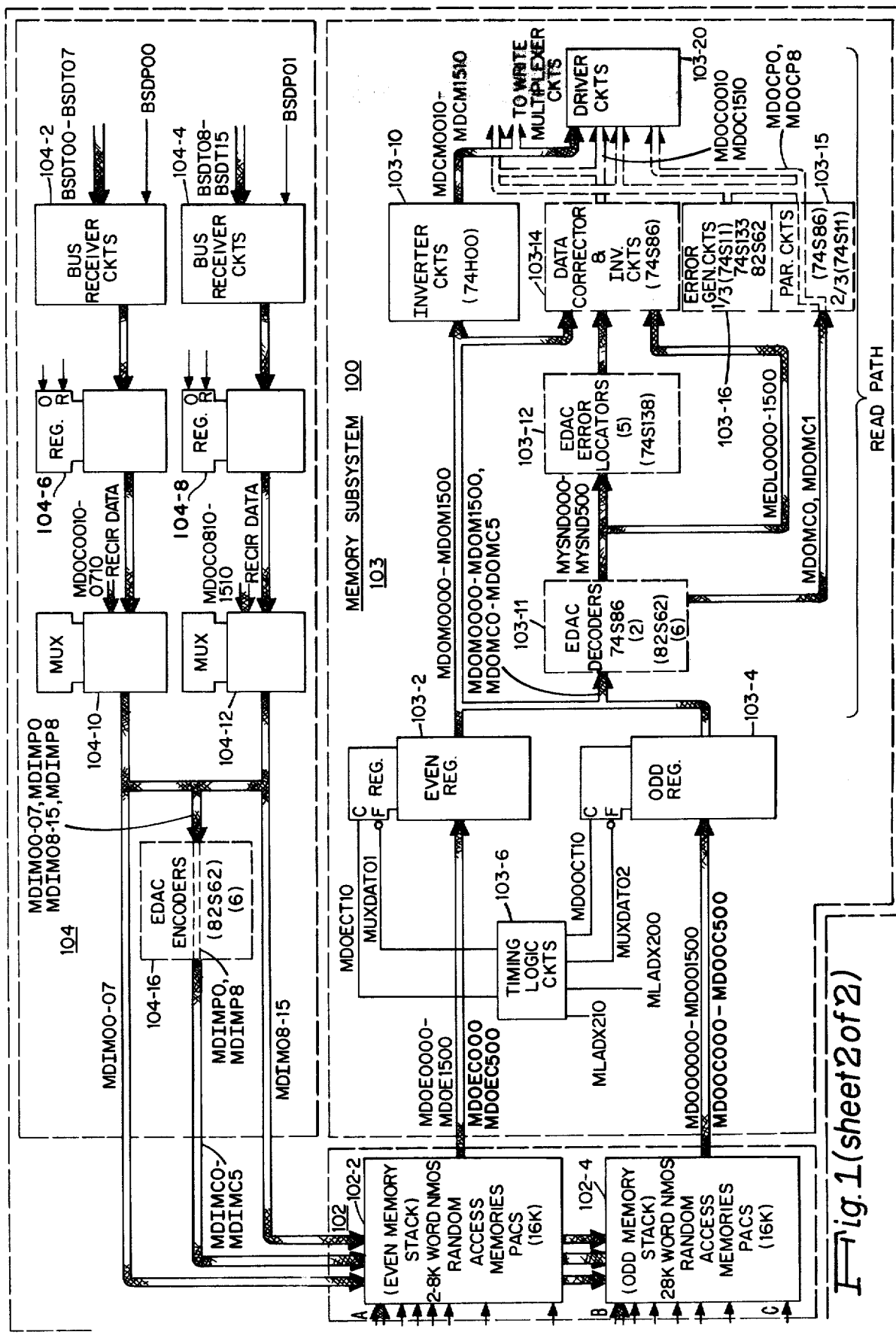
Fig. 1 (sheet 2 of 2)

PRINTED CIRCUIT BOARD APPARATUS WHICH FACILITATES FABRICATION OF UNITS COMPRISING A DATA PROCESSING SYSTEM

BACKGROUND OF THE INVENTION

1. Field of Use

This invention relates to circuit boards and more particularly to methods and circuit boards which facilitate fabrication of the various units of a data processing system.

2. Prior Art

Over the last fifteen years, integrated circuit (IC) technology has seen a change of four to five orders of magnitude in complexity. That is, such technology has gone from a single device on a chip to complexities of the order of tens of thousands of devices per chip. This has permitted computer manufacturers to offer a greater variety of hardware features to users at reduced cost.

However, while the advances made in integrated circuit technology has reduced the cost of incorporating such features into the various elements of a computer, the fabrication costs for such elements have increased.

For example, substantial cost reductions have been made in computer storage or memories as a consequence of the advances in integrated circuit technology. However, the inclusion of different types of error detection and/or correction circuits in addition to memory speed up, cache or fetch capabilities have necessitated manufacturers to provide a number of different types of memory units. This in turn has increased the number of different types of integrated circuit boards to be manufactured as well as increasing the number of integrated circuit chips normally included on a single circuit board. That is, computer manufacturers have provided for such options by developing different artworks for constructing types of circuit board designs for the number of possible combinations of options being offered. Others have reduced the number of circuit board designs by including several options on a single circuit board and connecting the circuits associated with only those options in use. While this has reduced fabrication costs, it has increased the number of integrated circuit parts required thereby increasing costs.

Accordingly, it is a primary object of the present invention to provide a technique and apparatus which facilitates the fabrication of the elements of a computer which include a variety of optional features.

It is a more specific object of the present invention to reduce the cost of computer units by minimizing the number of integrated circuit parts in constructing circuit boards including a number of optional features.

SUMMARY OF THE INVENTION

The above objects are achieved in accordance with a preferred embodiment of a memory subsystem constructed in accordance with the teachings of the present invention. The memory subsystem, designed to include one or more optional features, normally requires a number of different circuit board assemblies constructed from a corresponding number of different sets of artworks. However, in accordance with the principles of the present invention, the memory subsystem is constructed using a single artwork on a printed circuit board which includes at least two layers.

The artwork set is used to etch two layers of the printed circuit board to include the required number of horizontal and vertical paths to be connected to all of the integrated circuit chips to be positioned and interconnected thereon. The artwork causes the inclusion of predetermined patterns of interconnections between sets of holes in accordance with the present invention. In accordance with the present invention, the board includes first sets of holes drilled for mounting groups of integrated circuit chips required for implementing a first group of features and which are to be interconnected to the other integrated circuit chips of the subsystem (non-feature areas) mounted on related sections of the board.

In accordance with the principles of the invention, the board includes second sets of holes drilled on the board at a predetermined distance from the first sets of holes for either mounting alternative groups of integrated circuit chips which are to be interconnected to other integrated circuit chips or for providing alternative interconnections for certain groups of such other chips. The resulting arrangement provides for implementation of options alternative to the first group of features or options.

During the construction of a completed printed circuit board assembly, the board is populated with only those integrated circuit chips required for the construction of a memory subsystem with the desired options. The required number of integrated circuit chips after being positioned in the correct manner are then soldered to complete the interconnections to the other integrated circuit chips mounted on related sections of the board.

For example, in a preferred embodiment of the memory subsystem constructed in accordance with the teachings of the present invention, the subsystem can be constructed to include either a single word or double word fetch feature and either a parity check or error detection and correction (EDAC) feature. The first sets of holes are used to interconnect integrated circuit chips including the circuits required for the double word fetch option and circuits for the parity check feature. The second sets of holes are used to provide alternative interconnections for the integrated circuit chips required for the single word fetch feature and circuits for the EDAC feature.

It will be appreciated that the printed circuit board is populated with only those integrated circuit chips necessary in the construction of a memory subsystem having the combinations of selected features. This in turn minimizes the number of chips for a given subsystem. For example, in the case of a memory subsystem including a single word fetch capability, the additional chips required for the double word fetch are removed. More importantly, the method of the present invention in the case of the preferred embodiment makes possible the construction of four different memory subsystems utilizing a single artwork set.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIG. 1 shows a portion of a memory subsystem including certain optional features constructed in accordance with the principles of the present invention.

DESCRIPTION OF THE PREFERRED EMBODIMENT

Figure 2A:
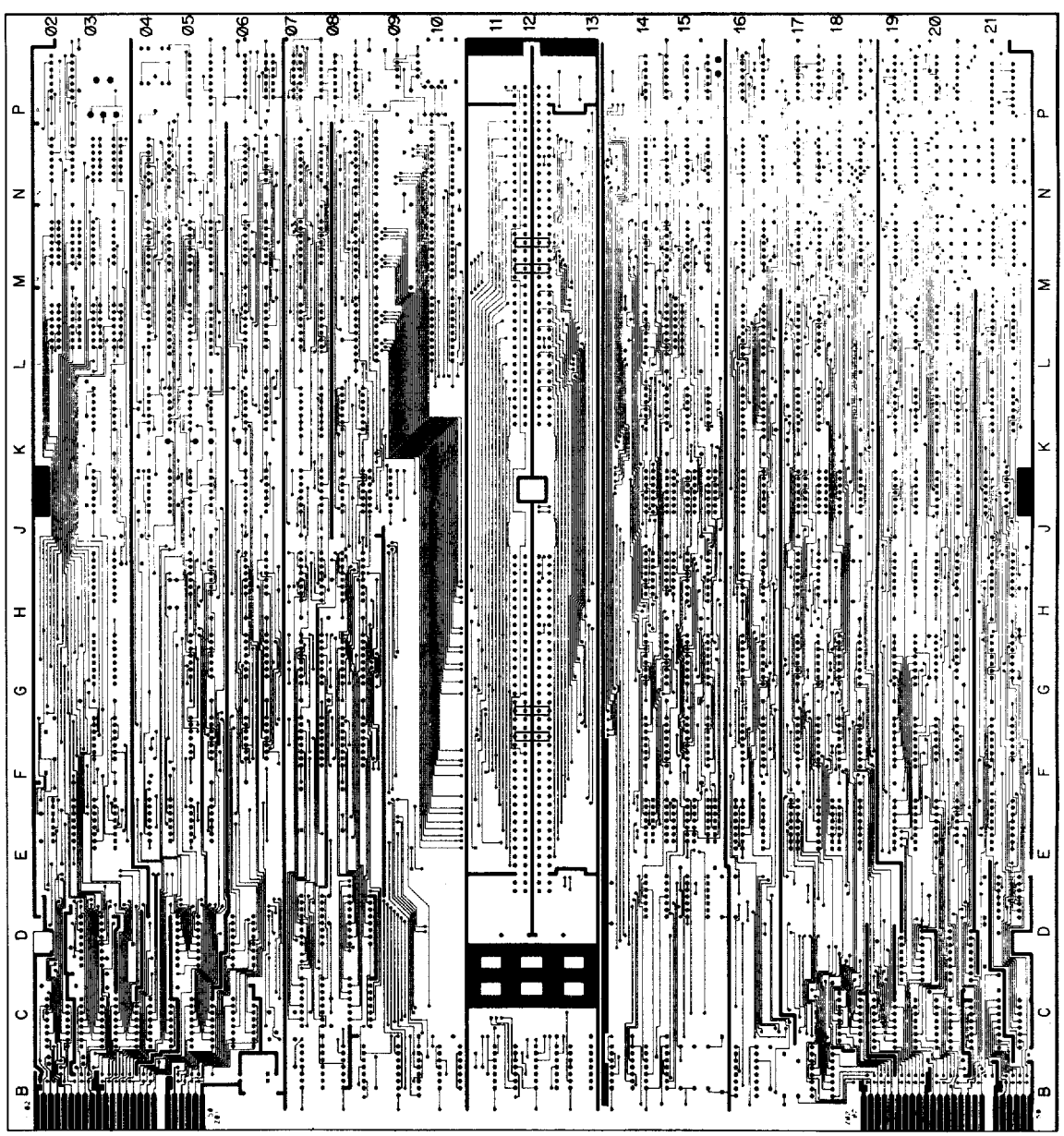
FIG. 2a and 2b illustrate the two layers of the set of artwork used in constructing the memory subsystem of FIG. 1.

A preferred embodiment of the present invention will be described with reference to FIGS. 1 through 8b. Referring first to FIG. 1, it is seen that the Figure shows a portion of the circuits includable within a memory subsystem 100 constructed in accordance with the teachings of the present invention. The subsystem 100 includes an address control and distribution section 101, a memory controller and a number of attachable 8K word memory units. The memory controller includes a read section 103 and write section 104. The memory units are included in a memory section 102.

The section 101 receives 24 address signal lines and one address parity line via a number of input/output driver-receiver circuits 101-2. The circuits provide the signals BSAD0010 through BSAD2210 and signal BSAP0010 which are distributed to different functional areas of the subsystem 100. That is, signals BSAD0010 through BSAD0610 and signal BSMREF10 are applied to compare circuits of block 101-4. These circuits provide proper identification of a memory module defined via static module select switches, not shown by generating an output signal MYADG010. The signals BSAD0710 and BSAD2210 are applied through a switch network 101-6 which generates signal BSADX010. This signal enables selection of the correct memory module which includes both stacks 102-2 and 102-4. Other circuits within block 101-4 generate an even module parity signal MODPAR00 in response to signals BSAP0010, BSAD0010 through BSAD0710.

The switch network 101-6 generates signals BSADX010 through BSADX510 which are applied as inputs to one or two address registers as explained herein. Depending upon which type of feature is selected for inclusion in the memory subsystem or controller, the printed circuit board is populated with circuits of one or both address registers in FIG. 1. More specifically, in the case of a memory subsystem which includes a double word fetch feature, the section 101 also includes the circuits of an even address register 101-8a and associated logic circuits 101-11a. Each address register includes a gate circuit for incrementing the register to ZEROS following the storage of an all ONES count in the least 8 significant bit positions.

The circuits of section 101 included with the selection of the double word fetch feature are illustrated in dotted lines. The inclusion of these circuits provide the controller with the capability of access two words from the memory section 102 and is termed a double word fetch feature. When the controller has the capability to access a single word at a time from memory section 102, this is termed a single word fetch feature. As explained herein, the memory subsystem 100 is not populated with the circuits illustrated in dotted lines. Dotted lines are also used in FIG. 1 to show the alternate connections of other input signals to a number of gates and inverters included in blocks 101-12 and 101-14 respectively and the decoder of block 101-10a which are required for inclusion of the double fetch feature. The connection arrangement will be explained in greater detail with reference to FIGS. 5 through 8b.

As seen from FIG. 1, for a memory subsystem having a double word fetch capability, the signals BSAD1115 through BSAD2010 and the signals BSADX010 through BSADX610 from switch network 101-6 are applied as inputs to the even address register 101-8a and to the odd address register 101-8b. During double word fetch operation, these registers store the address word received from the bus for a complete cycle of operation. The registers 101-8a and 101-8b permit the incrementing of the address word stored therein in response to increment signals MAREUC10 and MAROUC10 generated by the circuits of block 101-7 in accordance with the decoding of signals MEMBUZ10 and MLADX210. The circuits of block 101-7 include conventional gate inverter and storage circuits required for generating appropriate incrementing signals. Each of the NAND gates 101-9a and 101-9b generates the appropriate address strobe signal ADDSTR00 for loading the registers associated therewith. Both registers are cleared to ZEROS by signal MYCLRR10.

From the stages of the address registers 101-8a and 101-8b, the address signals MAREX310-MARE2010 and MARO1310-MARO2010 are applied via separate paths through the multiplexer circuits 101-11a and 101-11b respectively where they are combined with refresh address signals REFAD110 through REFAD610. The signals are then passed through the inverter circuits of blocks 101-14 and 101-16 to the MOS random access memories of the odd and even memory stacks 102-2 and 102-4. In a similar fashion, the signals MAREX410, MAREX510, MARE1110 and MARE1210 and signals MAROX410, MAROX510, MARO1110 and MARO1210 from the stages shown are applied through separate paths through the NAND gate circuits of blocks 101-12 and 101-18 respectively to the memory units of the even and odd stacks 102-2 and 102-4. Also, the signals MAREX10, MAREX310 and signals MAROX10 and MAROX310 are applied to the decoder circuits of blocks 101-10a and 101-10b respectively which in turn generate signals MCEDE010-MCEDE310 and MCED0010-MCED0310 applied to the enable clock circuits of memory units.

The signals MAREX400, MAREX510, MARE1100 through MARE2000 and the signals MAROX400, MAROX500, MARO1100 through MARO2000 provide the addresses within each of the two 8K MOS random access memories of the even and odd memory stacks 102-2 and 102-4 respectively. Since there are two 8K MOS memories, the gate circuits and inverter circuits of the blocks 101-12, 101-14, 101-18 and 101-16 are duplicated for each input address signal applied to the even and odd stacks 102-2 and 102-4. The signal MLADX200 establishes which stack receives delayed timing signals during double word fetch memory cycles while the signals MAREX100, MAREX300 and MAROX110, MAR0300 provide the appropriate enable clock signals for the odd and even memory stacks 102-2 and 102-4.

In the case of a memory subsystem which includes a single word fetch capability, the signals BSAD1110 through BSAD2010 and signals BSADX110 through BSADX610 are applied as inputs to odd address register 101-8b. From register 101-8b, the addresses are passed through the multiplexer circuits 101-11b where they are combined with the refresh address signals REFAD110 through REFAD610. From there, the address signals MADO1310-MADO2010 are passed through the inverter circuits of blocks 101-14 and 101-16 to the even and odd memory stacks 102-2 and 102-4. Similarly, the signals MAROX410, MAROX510, MAROX1110 and MADOX1210 are passed through the NAND gates included within blocks 101-12 and 101-18 and applied as inputs to the even and odd memory stacks. The signals MADEX400, MADEX500, MADE1100-MADE2000 and signals MADOX400, MADOX500, MADO1100-MADO2000 both derived from odd address register 101-8b provide the addresses for a memory location within each 8K MOS memory unit. Signals MAROX110 and MAROX310 are applied as inputs to both decoder circuits 101-10a and 101-10b for generation of the enable clock signals for the even and odd stacks 101-2 and 101-4.

The other sections 103 and 104 include the registers, multiplexer circuits and data control logic circuits which enable data to be written into and/or read from the even and odd memory stacks 102-2 and 102-4 to and from the bus. The memory subsystem 100 can have one of two data formats, one for memories having an EDAC option and one for memories having parity. In those subsystems having an EDAC capability, each word contains 16 data bits and 6 check bits used to detect and correct single bit errors in the data word and detect and signal without correction, double bit errors in the data word. The subsystems having a parity capability termed non-EDAC memories include words which contain 16 data bits and two parity bits, one for each byte of data.

During a read cycle of operation, the 16 data bits and two parity bits in a non-EDAC memory subsystem or the 16 data bits and 6 check bits in an EDAC memory subsystem are transferred from either odd or even addressed memory stack locations into even and odd local data registers 103-2 and 103-4. Each stack can be read independently of the other and in the case of a memory subsystem including a double word fetch, a cycle can be initiated wherein one stack is read out early and the other stack is read out later. The enabling of registers 103-2 and 103-4 is controlled by the circuits of block 103-6. These circuits can be considered conventional in design and are operative in response to signals MLADX200 and MLADX210 to force generate signals MUXDAT02 MUXDAT01 as required for the enabling of the registers 103-2 and 103-4.

In the case of non-EDAC memory subsystems, information word signals MDOM00-MDOM15 from even and odd registers 103-2 and 103-4 are applied as inputs to the circuits of block 103-10 which invert these signals to generate output signals MDOC0010 through MDOC1510. The parity signals MDOMCO and MDOMC1 are applied to the circuits of block 103-15 which inverts these signals to generate parity signals MDOCP010 and MDOCP810. These signals are applied as inputs to the driver circuits of block 103-20.

For EDAC memory subsystems, the data and check bit signals loaded into registers 103-2 and 103-4 are applied as inputs to six-nine bit parity generator circuits which comprise the EDAC decoders of block 103-11. These circuits generate six syndrome bit signals MSYND000 MSYND500.

The generated syndrome bit signals are applied as inputs to five error locator circuits included within block 103-12. These circuits decode the input signals applied thereto and generate appropriate output signals MEDLXX-00 for application to a number of exclusive OR circuits which comprise the corrector circuits of block 103-14. The corrector circuits compare the EDAC locator signals MEDLXX-00 with the incoming data signals MDOM00 through MDOM15 from registers 103-2 and 103-4. Upon the detection of a single bit error, the EDAC error locator circuits operate to invert the state of the data or check bit signal associated therewith. This in turn corrects the state of the data or parity information.

The circuits of block 103-16 and other circuits of block 103-15 generate bus parity signals and special error signals for signaling parity double bit and single bit error conditions respectively. For a more detailed explanation of how all such EDAC signals are generated as well as details regarding the operation of a preferred EDAC circuit arrangement, reference may be made to the copending patent application of George J. Barlow, et al entitled "Apparatus and Method for Storing Parity Encoded Data from a Plurality of Input/Output Sources" bearing Ser. No. 727,821, now U.S. Pat. No. 4,072,853, filed on Sept. 29, 1976 and which is assigned to the same assignee as named herein. As in the non-EDAC memory subsystem, the correct data signals MDOC00 through MCOC15 appearing at the outputs of the circuits 103-14 as well as the error signals appearing at the outputs of circuits of blocks 103-15 and 103-16 are applied as inputs to the driver circuits of block 103-20.

The section 104 performs two types of write operations, a word write operation and byte write operation. For the purpose of the present invention only the word write operation will be discussed herein. During a word write operation, the 16 data bit signals BSDT00-BSDT15 and 2 parity bit signals BSDP00 and BSDP01 are applied as inputs to the receiver circuits of blocks 104-2 and 104-4. The signals are in turn loaded into data registers 104-6 and 104-8. From there, the data and parity bit signals are applied as one input to each of a pair of multiplexer circuits 104-10 and 104-12. The data signals and parity signals read out from the section 103 are applied to the other input of each of the multiplexer circuits 104-10 and 104-12.

In non-EDAC memory subsystems, the data and parity bit signals are applied as inputs to the MOS memory units of stacks 102-2 and 102-4. In EDAC memory subsystems, the data and parity bit signals are applied as inputs to the EDAC encoder circuits of block 104-16. However, only the data bits are applied as inputs to the MOS memory units of stacks 102-2 and 102-4 together with the 6 check bits generated by the circuits of block 104-16.

The EDAC encoder circuits of block 104-16 include six 9 bit parity generator circuits which generator the 6 check bits written into memory section 102. Again, for further information regarding the operation of these circuits, reference may be made to the copending patent application of George J. Barlow, et al discussed previously.

It will be noted that FIG. 1 also includes the designations of the various types of integrated circuits which can be used in implementing the optional features includable in the memory subsystem 100. For example, the even address register 101-8a and multiplexer circuits 101-11a required for inclusion of the double word fetch option can be constructed using type SN74193 synchronous 4 bit up/down counters, type SN74S133, 13 input positive NAND gate and type SN74S157 quadruple 2 line to 1 line data selectors/multiplexers respectively. The gate buffer circuits of blocks 101-12 and 101-18 can be constructed using type SN74H00 quadruple 2 input positive NAND gates while the inverter circuits of blocks 101-14 and 101-16 can be constructed using type SN74H04 hex inverters. The decoder circuit of block 101-10a can be constructed using type SN74S00 quadruple 2 input positive NAND gates and type SN74S08 quadruple 2 input positive AND gates. Each of the circuit types mentioned are manufactured by Texas Instruments Inc. and are described in detail in the text "The TTL Data Book for Design Engineers" copyright 1973 by Texas Instruments Inc.

As concerns non-EDAC memory subsystems, the inverter circuits of block 103-10 can also be constructed using type SN74H00 quadruple 2 input positive NAND gates. For EDAC memory subsystems, the EDAC decoder circuits of block 103-11 and EDAC encoder circuits of block 104-16 can be constructed using type 82S62 nine bit odd/even parity generators/checkers manufactured by Signetics Corporation. The EDAC error locator circuits of block 103-12 can be constructed using type SN74S138 decoders while the EDAC data corrector and inverter circuits of block 103-14 can be constructed using type SN74S86 quadruple 2 input exclusive OR gates. The parity circuit of block 103-15 and error circuits of block 103-16 can be constructed using type SN74S11 triple 3 input positive AND gates and type SN74S86 two input exclusive OR gates. The block 103-16 can be constructed using a type SN74S11 triple three input positive AND gate, a type SN74S133 thirteen input positive NAND gate and a type 82S62 nine bit odd/even parity generator/checker. With the exception of the type 82S62 circuit chip, the remaining chip circuit types are manufactured by Texas Instruments Inc. For further information regarding the specific circuit arrangements, reference may be made to the copending application of George J. Barlow, et al as mentioned previously.

Figure 2B:
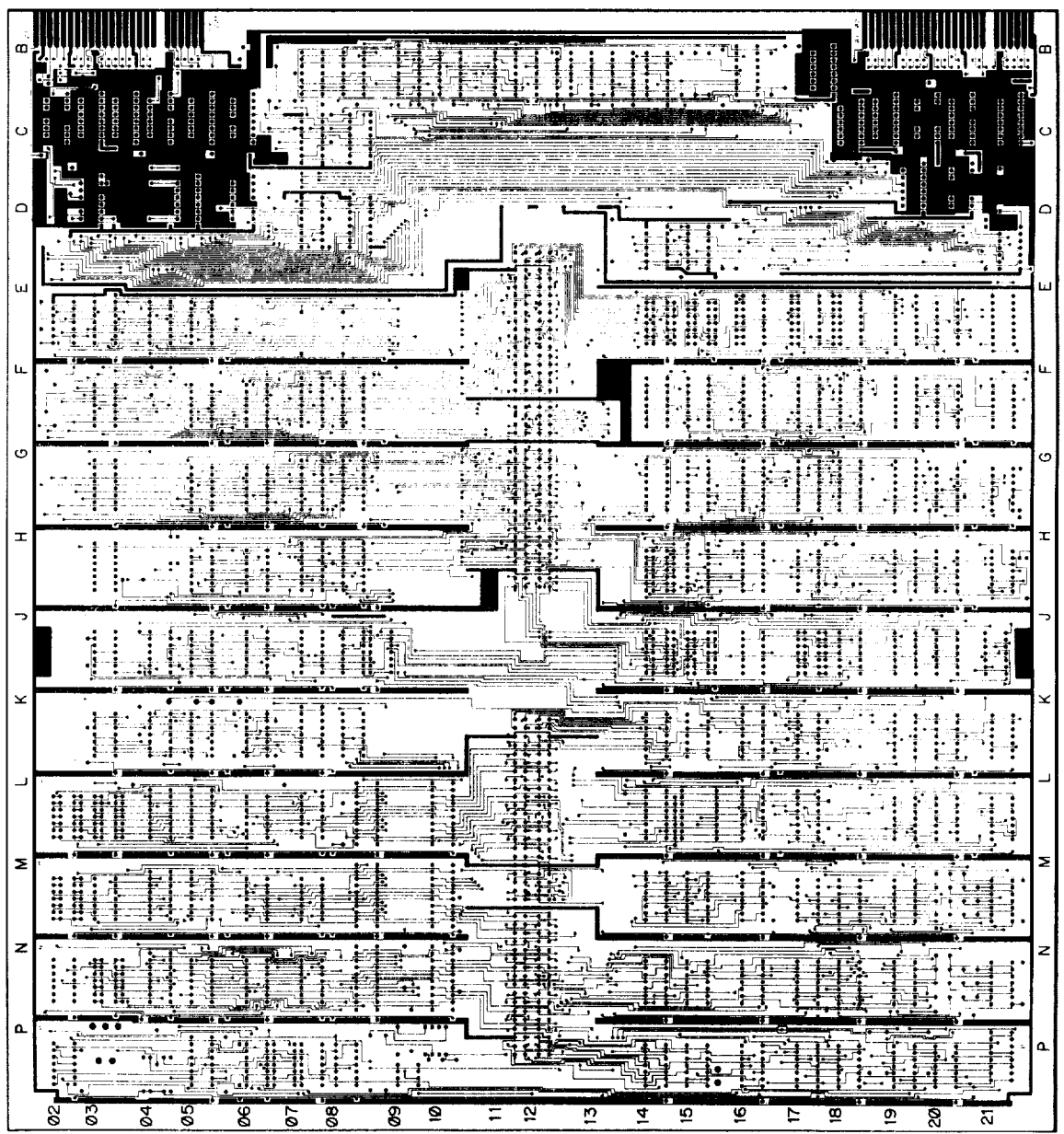

In accordance with the principles of the present invention, the memory subsystem 100 is constructed utilizing a two layer printed circuit board. FIGS. 2a and 2b show the first and second layers of the two layer artwork of the present invention. Pertinent portions of the two layer artwork used in the construction of the printed circuit board are shown in FIGS. 2c through 2h.

Figure 2C:
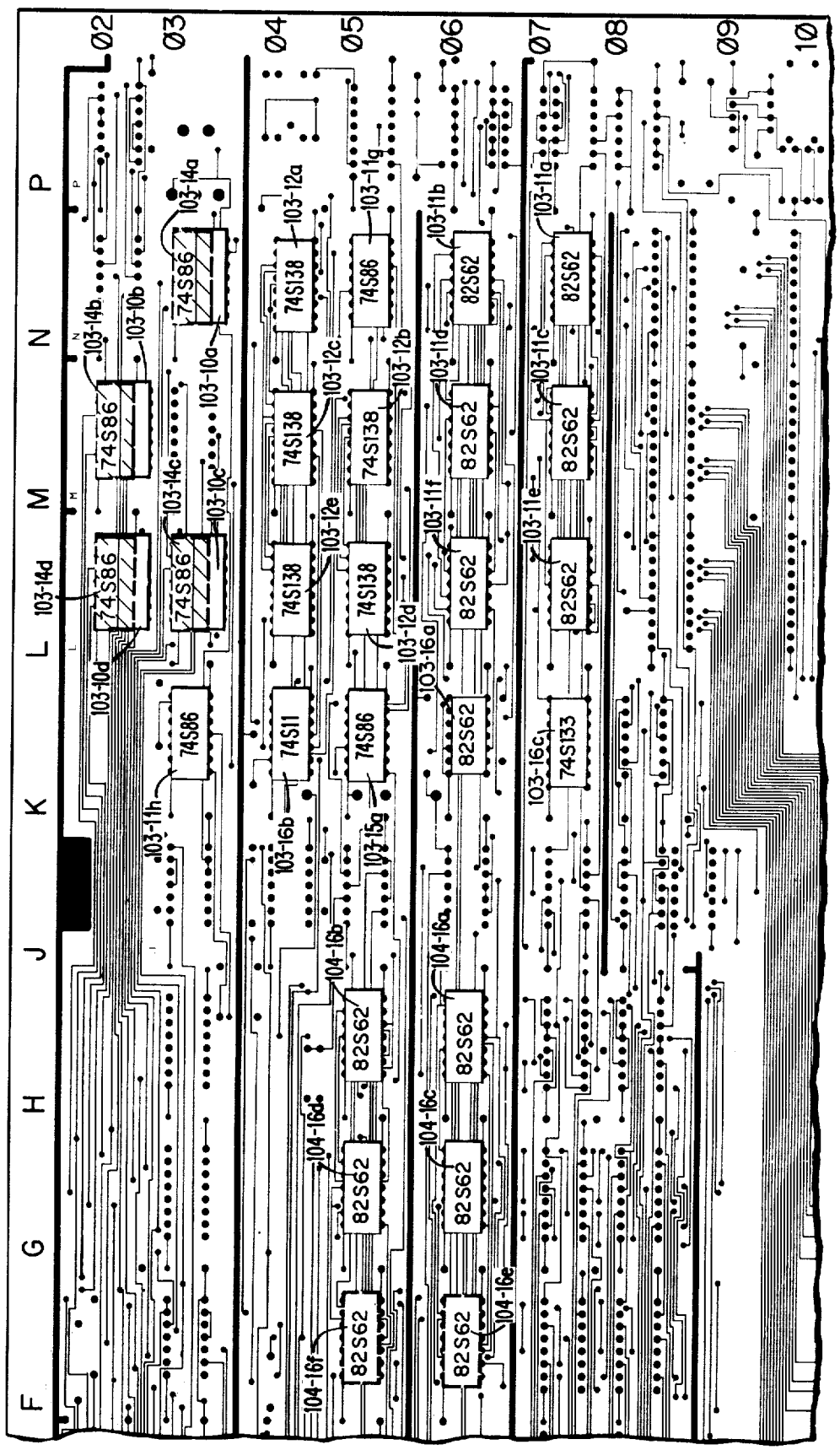
FIGS. 2c through 2h illustrate portions of the set of artwork and the specific integrated circuits used in constructing the memory subsystem of FIG. 1.
Figure 2D:
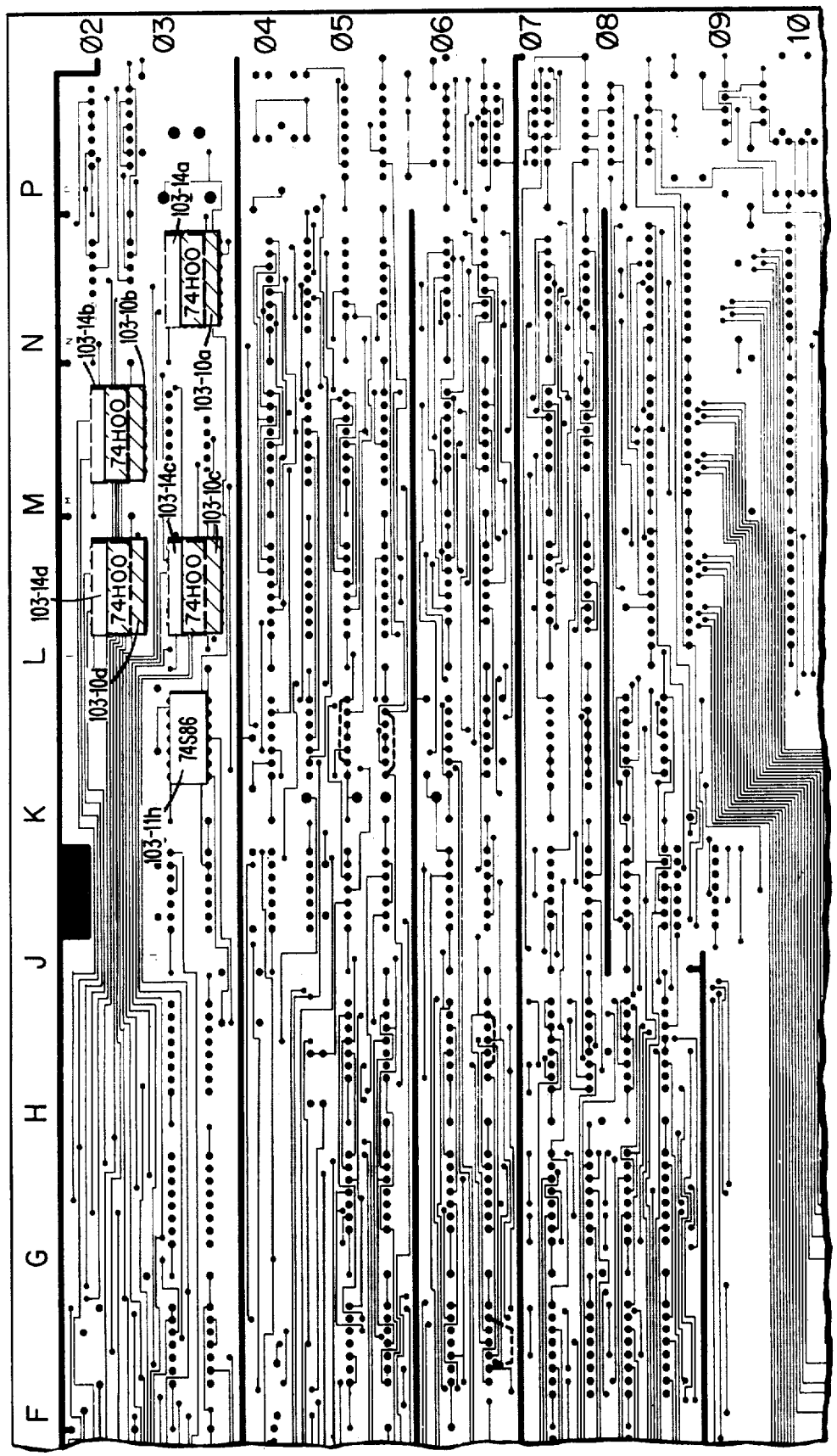
Figure 2E:
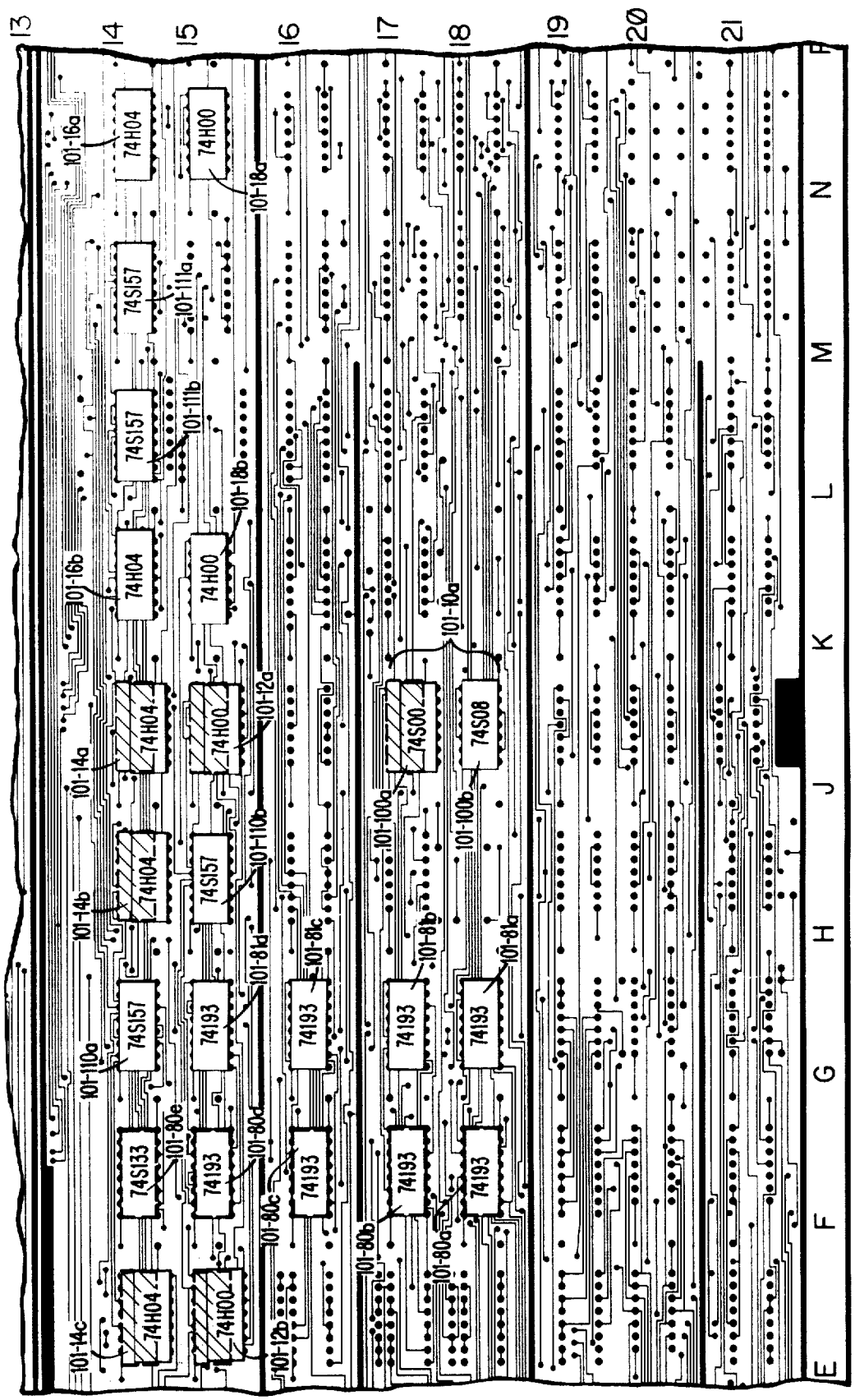
Figure 2F:
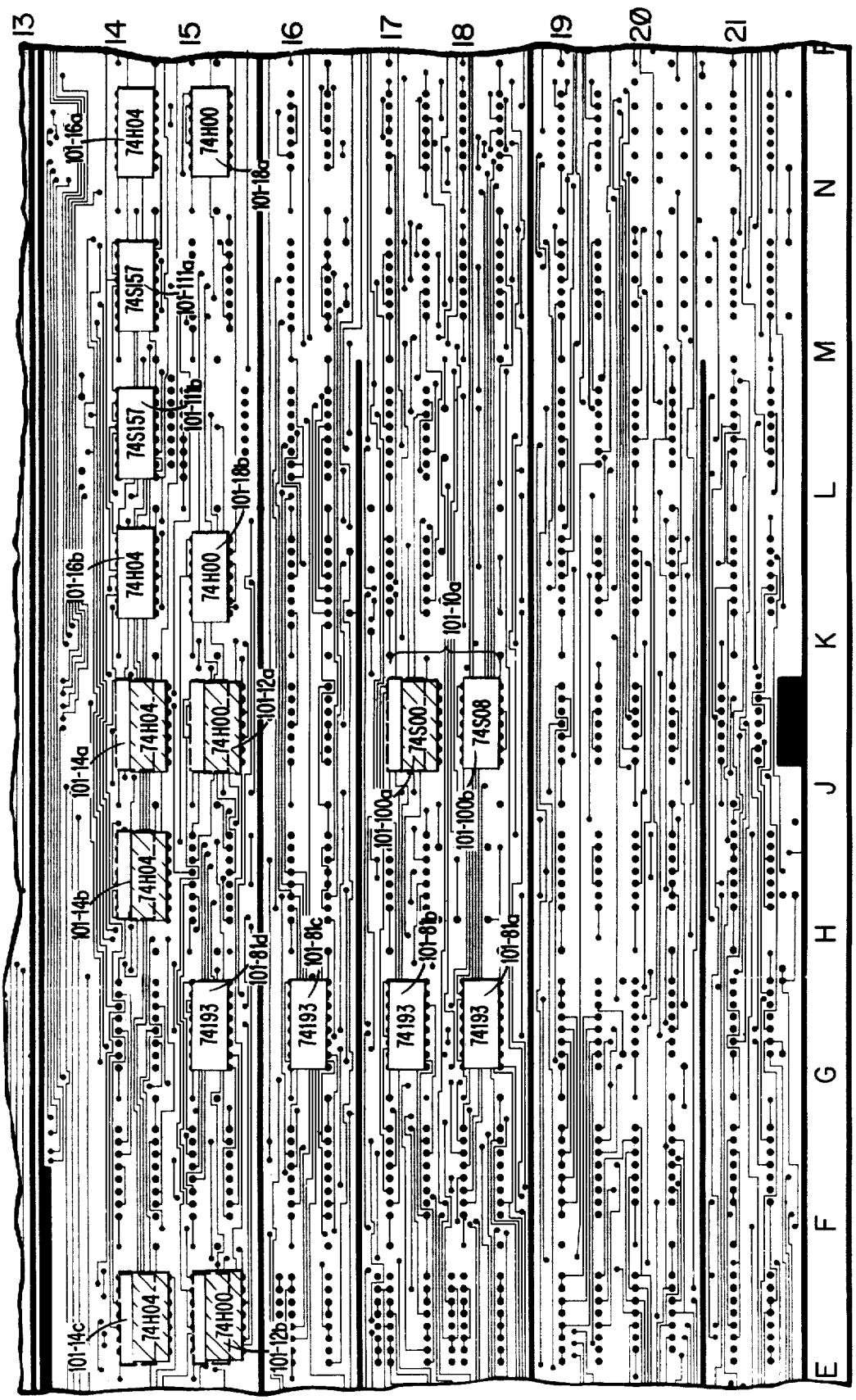
Figure 2G:
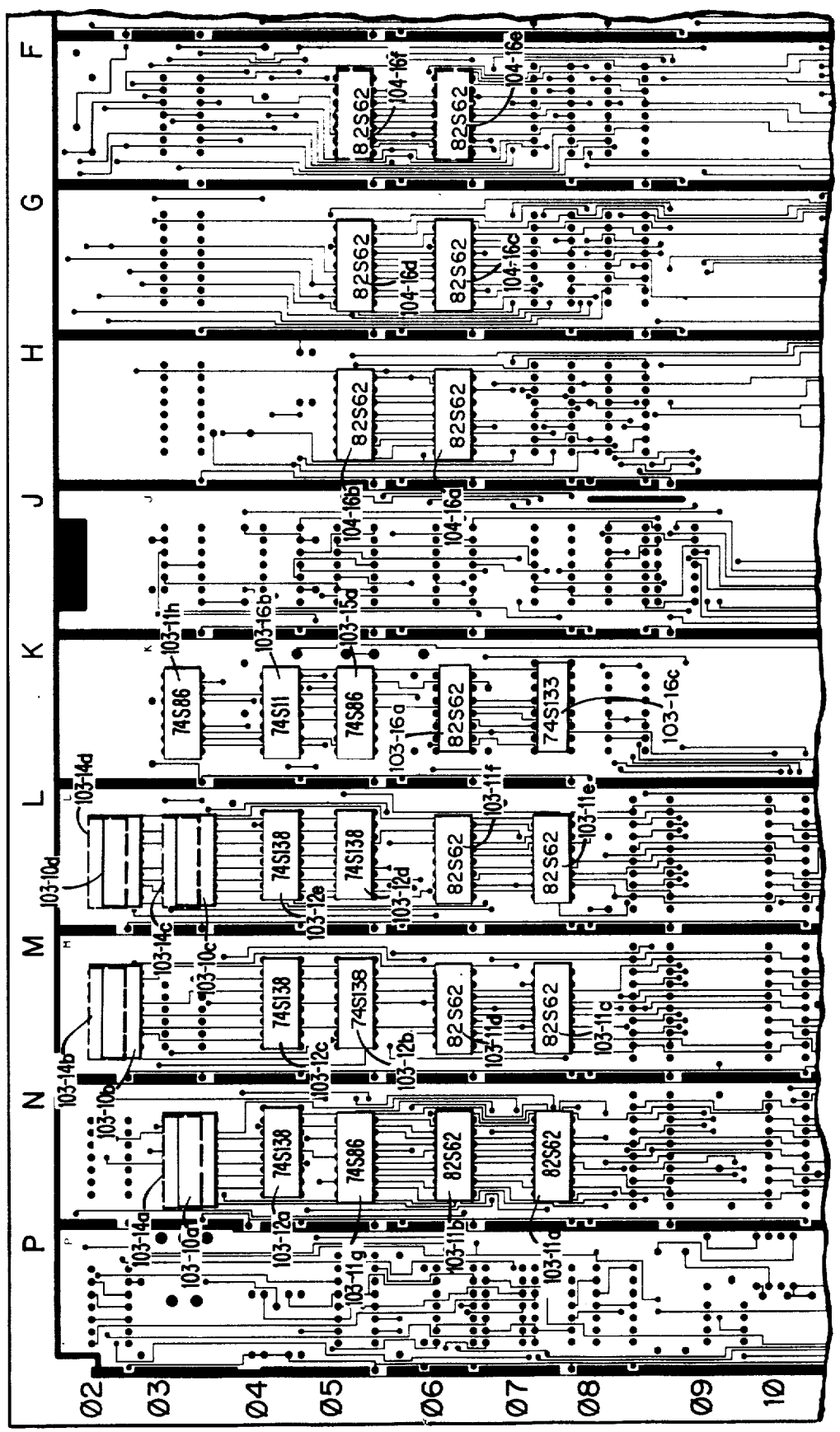

FIGS. 2c, 2d and 2g show the various horizontal and vertical connections on the first and second layers of artwork for interconnecting the various types of circuit chips for the optional inclusion of EDAC and non-EDAC features within the memory subsystem 100. The Figures also illustate the arrangements of sets of holes drilled in accordance with the present invention into which the circuit chips are to be inserted. The placement of the specific circuit chips associated with the EDAC feature illustrated in FIG. 1 with dotted lines into one set of holes is shown by dotted lines and shading in FIGS. 2c and 2g. The specific placement of the circuit chips associated with a non-EDAC feature illustrated in FIG. 1 with solid lines into an alternate set of holes is also shown by solid lines and shading in FIG. 2d.

Figure 2H:
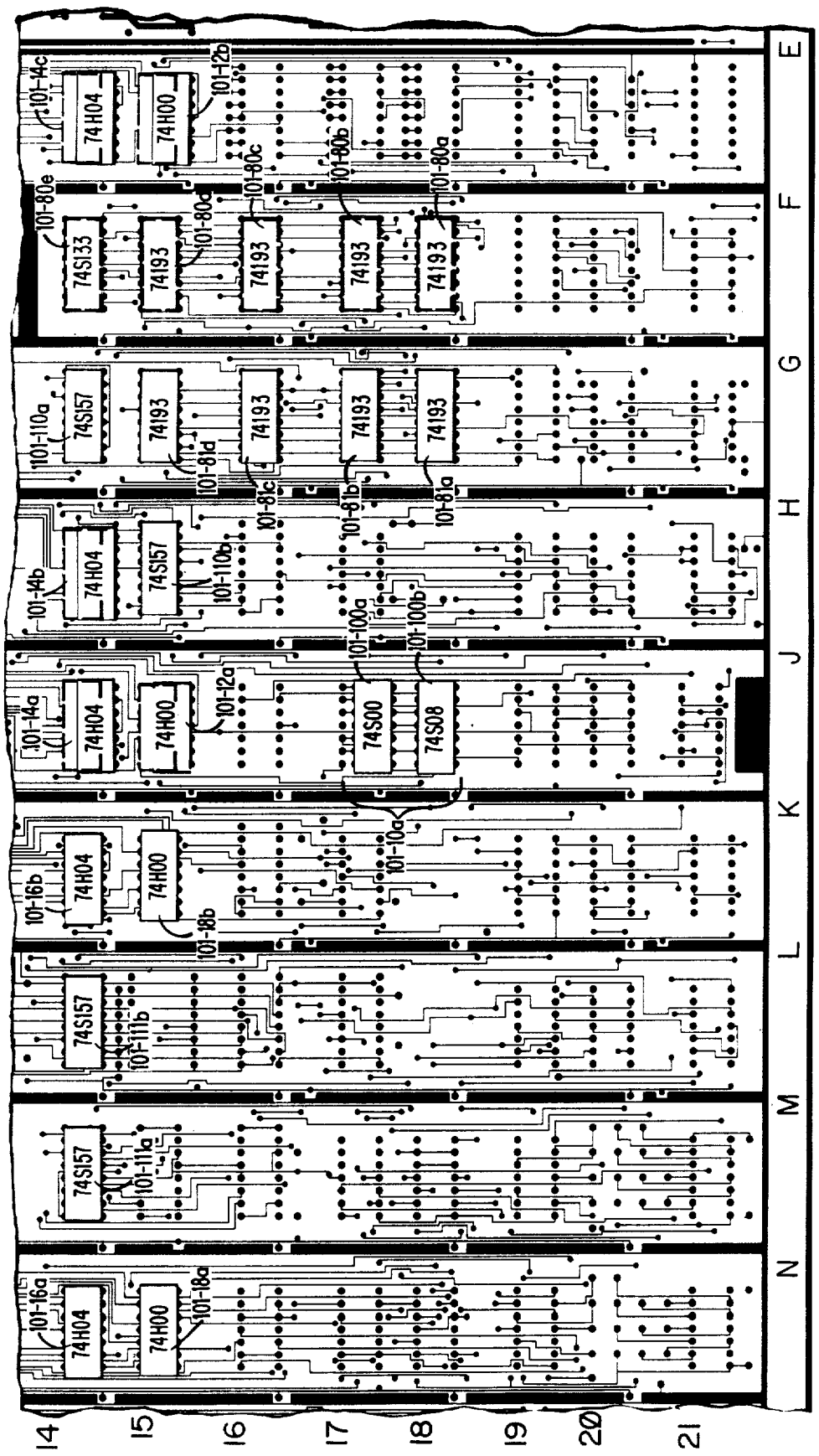

Similarly, FIGS. 2e, 2f and 2h, show the various horizontal and vertical connections on the first and second layers of artwork for interconnecting the various types of circuit chips for the optional inclusion of double word fetch and single word fetch features within the memory subsystem 100. Also, these Figures illustrate the arrangements of sets of holes drilled in accordance with the present invention into which the circuit chips are to be inserted. The specific placement of the circuit chips associated with the double word fetch feature illustrated in FIG. 1 with dotted lines into one set of holes is also shown by dotted lines and shading in FIGS. 2e and 2h. The specific placement of the circuit chips associated with a single word fetch illustrated in FIG. 1 with solid lines into an alternate set of holes is shown by solid lines and shading in FIG. 2f.

Figure 3:
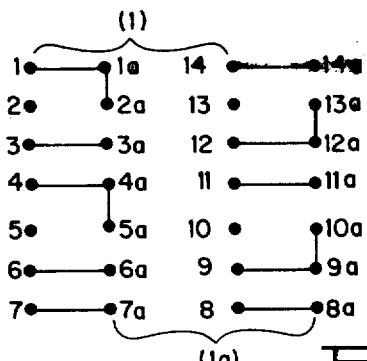
FIG. 3 shows in greater detail the interconnection arrangement of FIGS. 2c, 2d and 2g in accordance with the teachings of the present invention.
Figure 4:
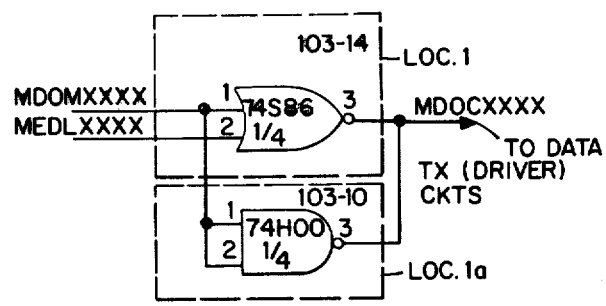
FIG. 4 shows in greater detail, the circuits and electrical connections of FIG. 3 for including a first set of optional features in the memory subsystem of FIG. 1.

FIGS. 2c and 2d will now be considered in greater detail with reference to FIGS. 3 and 4. FIG. 3 illustrates the interconnection arrangement of the first and second sets of holes for inclusion of optional EDAC and non-EDAC features in accordance with the teachings of the present invention. That is, the Figure illustrates in detail the connections of horizontal and vertical conductors to the first and second sets of holes. The horizontal hole connections correspond to those shown in FIG. 2a illustrating the first layer of single artwork. The vertical hole connections correspond to those shown in FIG. 2b illustrating the second layer of the same single artwork.

As seen from FIG. 3, a first set of holes is labeled 1 while a second or alternate set of holes is labeled 1a. In the preferred embodiment, the sets of holes are typically offset from each other by a distance of 100 mils or 0.1 inch center to center. Each set of holes accommodate the 14 pin connections of a particular integrated circuit chip package which includes one or more circuits. An example of the particular circuits which are inserted into the two sets of holes is shown in FIG. 4. In EDAC memory subsystems, exclusive OR circuits of a type SN74S86 package which is inserted into the set of holes designated location 1 provide the output signals to the driver circuits 103-20. In a non-EDAC memory subsystem, NAND gates of a type SN74H00 package which is inserted into the set of holes designated location 1a provide an alternate set of output signals to the driver circuits 103-20.

It will be noted that each exclusive OR circuit has one input terminal connected to receive a signal from the registers 103-2 and 103-4 of FIG. 1 (e.g. pin 1) while the other input terminal is connected to receive a signal from the circuits of block 103-12. The alternate circuit has both input terminals connected in common. This connection corresponds to the vertical line from 1a to 2a in FIG. 3. Also, one input terminal is connected to the input terminal of an exclusive OR circuit which receives a signal from registers 103-2 and 103-4 as shown in FIG. 4. This connection corresponds to the horizontal line from 1 and 1a in FIG. 3. Similarly, the output terminals of the two circuits are connected in common. This connection corresponds to the line from 3 to 3a in FIG. 3.

The remaining three exclusive OR circuits and NAND circuits are connected in the manner shown in FIG. 4 as illustrated by the lines in FIG. 3. With such interconnections, the appropriate output signals are provided by either the exclusive OR circuits or alternatively by the NAND circuits which function as inverter circuits by having both input terminals connected together.

In accordance with the present invention, for constructing a memory subsystem including an EDAC feature, the two layer printed circuit board is populated with specific types of integrated circuit chip packages. That is, location NO3, MO2, LO2 and LO3 are populated with type SN74S86 circuit packages 103-14a through 103-14d which appear shaded within dotted lines in FIG. 2c. The printed circuit board is also populated with the remaining integrated circuit packages 103-11a through 103-11f, 103-12a through 103-12e, 103-15a and 103-15b, 103-16a and 103-16b and 104-16a through 104-16f. Integrated circuit packages not shown are also included in printed circuit boards which correspond to the other circuits which comprise the memory subsystem 100.

In accordance with the present invention, for construction of a non-EDAC memory subsystem, the two layer printed circuit board has the alternate set of holes at locations NO3, MO2, LO2 and LO3 populated with type SN74H00 circuit packages 103-10a through 10d. These packages appear shaded within solid lines in FIG. 2d. As seen from FIG. 2d, the printed circuit board is not populated with the EDAC integrated circuit packages 103-11a through 103-11g, 103-12a through 103-12e, 103-15a and 103-15d, 103-16a and 103-16b and 104-16a through 104-16f. In fact, package 103-11h can also be removed with respect to the present invention. It is shown only because a portion of it is used for diagnostic purposes. It will be noted from FIGS. 1 and 2d that certain connections or jumpers are inserted into the circuit board. The jumpers apply input and output parity signals to blocks 102 and 103-20 respectively required with the removal of the circuits of blocks 104-16 and 103-15. Hence, the above arrangement of the present invention enables the removal of a considerable number of integrated circuit chips thereby reducing the overall manufacturing costs of the memory subsystem.

Figure 5:
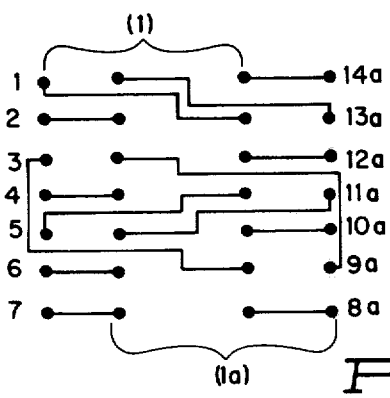
FIGS. 5 and 7 show in greater detail the interconnection arrangement of FIGS. 2e, 2f and 2h in accordance with the teachings of the present invention.
Figure 6:
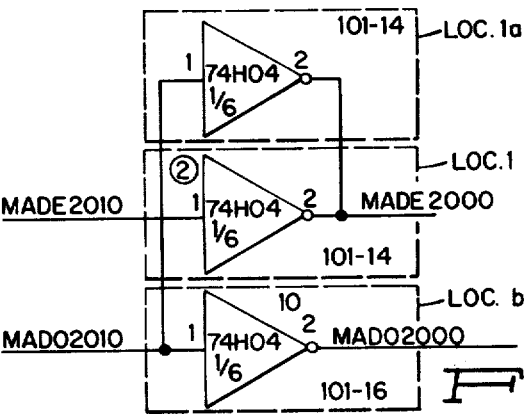
FIGS. 6, 8a and 8b show in greater detail, the circuits and electrical connections of FIG. 4 for including a second set of optional features in the memory subsystem of FIG. 1.
Figure 7:
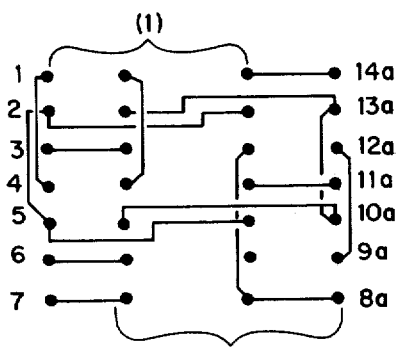
Figure 8A:
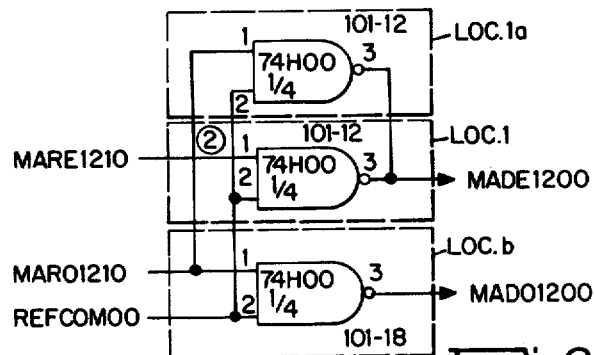
Figure 8B:
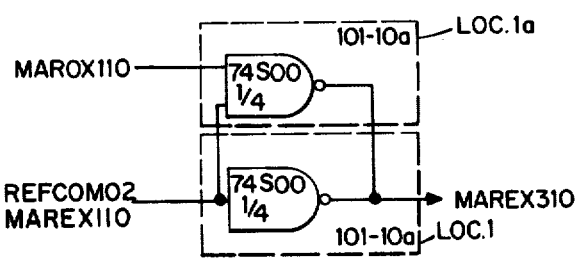

FIGS. 2e and 2f will now be considered in greater detail with reference to FIGS. 5 through 8b. FIGS. 5 and 7 illustrate in detail the interconnection arrangements of the first and second sets of holes for inclusion of optional double wood fetch and single word fetch features in accordance with the teachings of the present invention. FIG. 5 illustrates in detail the connections of both horizontal and vertical conductors to first and second sets of holes for the inclusion of the inverter circuits of blockk 101-14 of FIG. 1. FIG. 7 illustrates in detail, the connections of both horizontal and vertical conductors to first and second sets of holes for the inclusion of the NAND gates of block 101-12 of FIG. 1. FIGS. 6 and 8a illustrate examples of the specific circuits and connections derived from the arrangements of FIGS. 5 and 7 respectively. FIG. 8b shows an example of the specific input circuits and connections for decoder 101-10a.

Referring to FIG. 5, it is seen that when the integrated circuit package type SN74 H04 is positioned in location 1, each of the inverter circuits has its input terminal connected to receive an input signals from the even address register 101-8a of FIG. 1 (see FIG. 6). The output terminal of each inverter circuit is connected to apply an output signal to the even memory stack 102-2. It will be appreciated that there are two inverter circuits used to generate the same signals for distribution to the even memory stack. This is denoted by the number "2" in FIG. 6. When the package type SN74H04 is positioned in location 1a, each of the inverter circuits has its input terminal connected to receive an input signal from the odd address register 101-8b of FIG. 1 (see FIG. 6). The output terminal of each inverter circuit is connected to apply an output signal to even memory stack 102-2. Again, two inverter circuits are used.

FIG. 7 shows a similar arrangement wherein when the integrated circuit package type SN74H00 is positioned in location 1, each of the NAND gates has its input terminal connected to receive an input signal from the even address register 101-8a of FIG. 1 (see FIG. 8a). The output terminal of each NAND gate is connected to apply an output signal to the even memory stack 102-2. Similarly, there are two NAND gates used to generate the same signals for distribution to the even memory stack. This is denoted by the number "2" in FIG. 8a. When package type SN74H40 is positioned in location 1a, each of the NAND gates has its input terminal connected to receive an input signal from the odd address register 101-8b of FIG. 1 (see FIG. 8a). The output terminal of each NAND gate is connected to apply an output signal to the even memory stack 102-2. FIG. 8b shows the alternate positions for the integrated circuit package type SN74S00 used for decoder 101-10a. When the SN74S00 is positioned in location 1, each of the one-half of the NAND gates has it input terminal connected to receive an input signal from even address register 101-8a. The output terminal of each NAND gate is connected to apply an output signal to one input terminal of one of the for AND gates of type SN74S08 used for decoder 101-10a.

When the type SN74S00 is positioned in location 1a, each of one-half of the NAND gates has its input terminal connected to receive an input signal from the odd address register 101-8b. The output terminal of each NAND gate is connected to apply an output signal to one input terminal of one of the four AND gates of type SN74S08 used for decoder 101-10a.

In both instances, the other half of the NAND gates each have one input terminal connected to the output terminal of one of the other half of NAND gates. All NAND gates have the other input terminal connected to receive signal REFCOM00. Thus, pairs of NAND gates are connected to form a bistate device. The specific interconnection arrangement is similar to that of FIG. 7 and is shown in FIGS. 2a and 2b.

When populating a printed circuit board for a memory subsystem which includes a double word fetch feature, the integrated circuit packages designated 101-80a through 101-80e, 101-111a and 101-111b located at rows F–H of FIG. 2e shown shaded within dotted lines are included on such circuit board. The packages 101-80a through 101-80e correspond to the even address register 101-8a of FIG. 1 while packages 101-111a and 101-111b correspond to the multiplexer 101-11a. Additionally, the type SN74H00 and SN74H04 integrated circuit packages are positioned as shown shaded within dotted lines at rows E, H and J of FIG. 2e.

For a memory subsystem which includes a single word fetch feature, the type SN74H00, type SN74H04, and type SN74S00 integrated circuit packages are positioned as shown in solid lines at rows E, H and J of FIG. 2f. When so positioned, each inverter circuit of the circuit packages SN74H04 is positioned at location 1a of FIG. 6 wherein it has its input terminal connected to the input terminal of another inverter circuit of a type SN74H04 package positioned at another location (e.g. location b) which is connected to receive an input signal from the odd address register 101-8b. The output terminal of each inverter circuit is connected to provide an output signal to even memory stack 102-2. FIG. 5 illustrates the required vertical and horizontal connector connections.

In a similar fashion, when so positioned, each NAND gate of the circuit packages SN74H00 is positioned at location 1a of FIG. 8a wherein it has its input terminal connected to the inputer terminal of another NAND gate of a type SN74H00 package positioned at another location (e.g. location b) which is connected to receive an input signal from the odd address register 101-8b. The output terminal of each NAND gate is connected to provide an output signal to even memory stack 102-2. FIG. 7 illustrates the required vertical and horizontal connections. Also, when so positioned, each NAND gate of circuit package SN74S00 is positioned at location 1a of FIG. 8b wherein it has its input terminal connected to receive a signal from odd address register 101-8b.

In the case of a memory subsystem which includes a single word fetch feature, the packages 101-80a through 101-80e, 101-111a and 101-111b as seen from FIG. 2f are not included on the printed circuit board. Thus, only the circuits necessary to construction of this type of memory system are included.

As concerns the manner of fabricating the printed circuit boards for all of the possible combinations of memory subsystem features, conventional techniques be employed utilizing the artwork of FIGS. 2a and 2b. Specifically, a two layer printed circuit board is drilled to provide the required holes including both sets of holes offset to one another in accordance with the present invention. The drilling is done in a conventional manner by an automated drill machine. Such machines have a multiplicity of drills and are capable of drilling at one time holes in a number of circuit boards which have been properly positioned within the machine work area. The locations of holes to be drilled in terms of X and Y coordinates and their sizes are set out on a so-called drill document. This information is fed to the machine which then drills all of the holes of a given size. For example, this could include the holes for mounting all of the integrated circuit packages. Next, the machine is set up to drill all of the holes of a next size, such as those required for mounting components, hardware, etc.

As well known, the printed circuit board comprises a substrate material to which a thin laminate of conductive material such as an alloy of copper is bonded to both sides. Utilizing conventional photographic techniques, both sides of the conventional two layer printed circuit board are photographed utilizing a transparency of the common artwork. That is, photosensitive material is then applied to the copper laminates and the transparency of the circuit artwork is accurately positioned relative to the board. Next, the board is photographed and the image is developed utilizing techniques similar to those required to produce a snapshot or film.

Next, the board is subjected to chemicals which etch away the copper in the exposed areas or unexposed areas depending upon the process to form the patterns of conductors and pads by compassing the holes. Typically, the holes are 42 mils while the pads are 62 mils. This is illustrated in FIGS. 2e-2h. Thereafter, the various types of integrated circuit packages are inserted onto the first or top layer of the printed circuit board as illustrated in FIGS. 2c through 2f (top layer) in accordance with the teachings of the present invention to provide a memory subsystem with the desired combination of features. Next, the board is dipped or otherwise provided with a coating of solder using conventional techniques. This connects the pin connections of the integrated circuit packages to the conductors completing construction of the memory subsystem.

From the foregoing, it is seen how the arrangement of the present invention facilitates the fabrication of a memory subsystem capable of including a number of optional features. Moreover, the arrangement reduces the testing of a number of different memory systems to essentially that of a single memory system. It will be obvious to those skilled in the art that many modifications may be made to the invention without departing from its teaching. For example, different features may be included, which employ different type integrated circuit packages.

While in accordance with the provisions and statutes there has been illustrated and described the best form of the invention known, certain changes may be made to the system described without departing from the spirit of the invention as set forth in the appended claims and, in some cases, certain features of the invention may be used to advantage without a corresponding use of other features.

What is claimed is:

1. Apparatus for constructing a number of different memory subsystems including a number of different features which define the type of memory subsystem, said apparatus comprising:
   a plurality of integrated circuit packages;
   a two layer printed circuit board comprising a number of sections, each section having a number of groups of first sets of holes defining a number of positions included thereon for mounting a corresponding number of said plurality of integrated circuit packages, each package having a number of pins;
   first and second layers of said two layer board each having a number of horizontal and vertical conductors respectively for applying electrical signals to said pins of each of said integrated circuit packages mounted on said board;
   at least one of said number of sections including second sets of holes parallel to and offset from a plurality of said number of groups of said first sets of holes, each group of said second set of holes arranged to have the same position for electrically connecting the pins of certain ones of said plurality of integrated circuit packages mounted on said board to predetermined ones of said horizontal and vertical conductors required for the inclusion of one of a pair of said features for construction of one of said different memory subsystems.

2. The apparatus of claim 1 wherein said first and second sets of holes of said one section enable connection of said pins of corresponding ones of said plurality of integrated circuit packages to alternate ones of said horizontal and vertical conductors for applying different sets of signals from other ones of said plurality of integrated circuit packages mounted on said board.

3. The apparatus of claim 2, wherein said certain ones of said plurality of integrated circuit packages are mounted in said first set of holes and include a plurality of logic gating circuits corresponding to a first one of said pair of features for construction of a double fetch memory subsystem.

4. The apparatus of claim 3 wherein said certain ones of said plurality of integrated circuit packages are mounted in said second set of holes in place of those inserted into said first set of holes and include a plurality of logic gating circuits corresponding to a second one of said pair of features for construction of a single fetch memory subsystem wherein a number of the other ones of said number of integrated circuit packages are removed from said board for said construction.

5. The apparatus of claim 4 wherein said other ones of said number of integrated circuit packages include address register circuits and multiplexer circuits.

6. The apparatus of claim 1 wherein said board includes another plurality of integrated circuit packages and wherein another one of said number of sections includes a second set of holes being located parallel to and offset from a plurality of said number of groups of said first holes for electrically connecting the pins of said another plurality of integrated circuit packages identical in width to said integrated circuit packages of said plurality in place of certain ones of said plurality of integrated circuit packages.

7. The apparatus of claim 6 wherein said another plurality of integrated circuit packages are mounted in said first set of holes and include a plurality of error detection and correction circuits corresponding to a first one of said pair of said features for construction of an EDAC memory subsystem.

8. The apparatus of claim 7 wherein said certain ones of said plurality of integrated circuit packages are mounted in said second set of holes in place of those in said first holes and include a plurality of error detection circuits corresponding to a second one of said pair of said features for construction of a non-EDAC memory subsystem wherein a number of the other ones of said number of integrated circuit packages are removed from said board for said construction.

9. The apparatus of claim 8 wherein said other ones of said number of integrated circuit packages include EDAC decoder circuits, EDAC error locator circuits and error generation and check circuits.

10. Apparatus for use in a number of different memory subsystems having different combinations of features defining the type of memory subsystem, said apparatus comprising:
a plurality of integrated circuit packages, each having a number of pins;
a two layer printed circuit board including first and second layers having a number of vertical and horizontal conductors respectively for applying electrical signals to said pins of each of said integrated circuit packages;
said circuit board comprising a number of sections, each section having a number of groups of first sets of holes for defining a number of physical locations for mounting a corresponding number of said plurality of said integrated circuit packages thereon, at least first and second ones of said number of sections each including second sets of holes parallel to and offset a predetermined minimum distance from a plurality of said number of groups of said first set of holes for mounting certain ones of said plurality of said integrated circuit packages for electrical connection to different groups of said number of horizontal and vertical conductors required for the inclusion of at least a different pair of said features at the same physical locations as said first sets of holes associated therewith.

11. The apparatus of claim 10 wherein said first sets and second sets of said holes of at least said first one of said sections connect the pins of the integrated circuit packages mounted thereon to alternate horizontal and vertical conductors for applying alternate sets of electrical signals from other ones of said number of integrated circuit packages of said first one of said sections required for a corresponding one of said pair of features.

12. The apparatus of claim 11 wherein said first sets and second sets of said holes of at least said second one of said sections enable connection of alternate certain ones of said plurality of said integrated circuit packages to be mounted on said board to horizontal and vertical conductors for applying the same sets of electrical signals from other ones of said number of integrated circuit packages of said second one of said sections.

13. The apparatus of claim 12 wherein said certain ones of said integrated circuit packages of said first one of said sections are mounted into said first set of holes include a plurality of error detection and correction circuits corresponding to a first one of said pair of said features for construction of an EDAC memory subsystem.

14. The apparatus of claim 13 wherein said certain ones of said plurality of integrated circuit packages are mounted in said second set of holes in place of those in said first holes and include a plurality of error detection circuits corresponding to a second one of said pair of said features for construction of a non-EDAC memory subsystem wherein a number of the other ones of said number of integrated circuit packages are removed from said board for said construction.

15. The apparatus of claim 14 wherein said other ones of said number of integrated circuit packages include EDAC decoder circuits, EDAC error locator circuits and error generation and check circuits.

16. The apparatus of claim 12 wherein said certain ones of said plurality of integrated circuit packages are mounted in said first set of holes and include a plurality of logic gating circuits corresponding to a first one of said pair of features for construction of a double fetch memory subsystem.

17. The apparatus of claim 16 wherein said certain ones of said plurality of integrated circuit packages are mounted in said second set of holes in place of those inserted into said first set of holes and include a plurality of logic gating circuits corresponding to a second one of said pair of features for construction of a single fetch memory subsystem wherein a number of the other ones of said number of integrated circuit packages are removed from said board for said construction.

* * * * *